United States Patent [19]

Graham

[11] Patent Number: 4,800,344

[45] Date of Patent: Jan. 24, 1989

[54] BALUN

[75] Inventor: Martin H. Graham, Berkeley, Calif.

[73] Assignee: And Yet, Inc., Berkeley, Calif.

[21] Appl. No.: 109,348

[22] Filed: Aug. 27, 1987

Related U.S. Application Data

[63] Continuation of Ser. No. 795,374, Nov. 5, 1985, abandoned, which is a continuation-in-part of Ser. No. 715,129, Mar. 21, 1985, Pat. No. 4,717,896.

[51] Int. Cl.$^4$ ............................................... H03H 7/42
[52] U.S. Cl. .......................................... 333/25; 333/32
[58] Field of Search ........................ 333/12, 25, 26, 32

[56] References Cited

U.S. PATENT DOCUMENTS 3,195,076  7/1965  Morrison .............................. 333/26
3,778,759  12/1973  Carroll ............................... 333/12 X

OTHER PUBLICATIONS

Sekhri, S. J., "Power Line Filter", *IBM Technical Disclosure Bulletin*, vol. 17, No. 7; Dec. 1974, p. 1998.

Primary Examiner—Eugene R. LaRoche
Assistant Examiner—Benny Lee
Attorney, Agent, or Firm—Blakely, Sokoloff, Taylor & Zafman

[57] ABSTRACT

The present invention comprises a balun for intercoupling an at least partially unbalanced line and a substantially balanced line having similar line impedances which is capable of passing differential signals over a wide bandwidth while substantially attenuating any common mode signals. The balun comprises a pair of transformers with bifilar windings, each connected as a choke. Each conductor of the unbalanced line is coupled to a different one of two substantially identical inductances of the first transformer and the other side of each inductance is coupled through the second transformer to a different one of the two conductors of the balanced line. Each of the connections between the two transformers is coupled to ground with a substantially identical capacitance. The capacitance in conjunction with the inductance acts to filter out the common mode signals while allowing the differential mode signals to pass through the balun. The capacitance is coupled to each transmission line by a transformer with sufficient inductance to prevent differential signals in either direction from being shunted to ground. Preferably, a resistor is added in parallel to each of the capacitances to provide for common mode attenuation at the resonant frequency of the system capacitance and inductances.

4 Claims, 3 Drawing Sheets

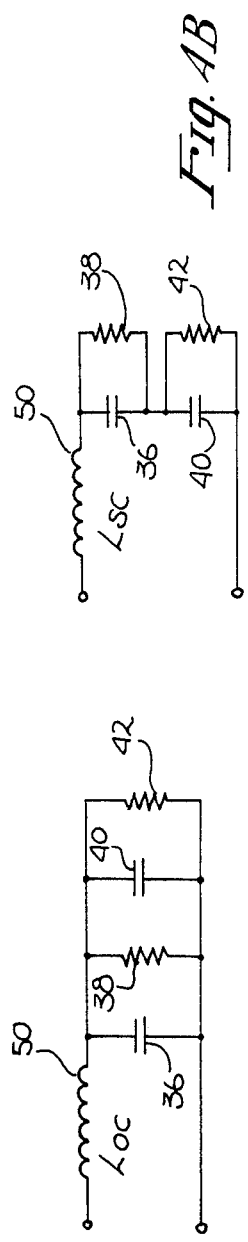
Fig. 4A
Fig. 4B
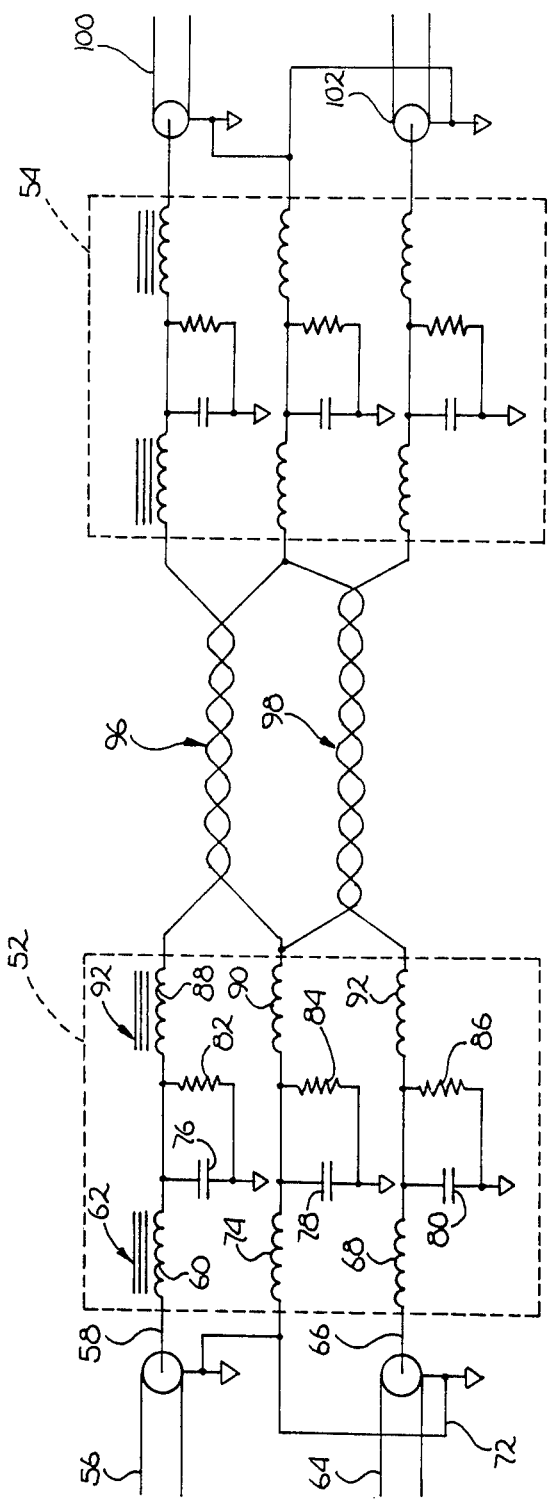
Fig. 5

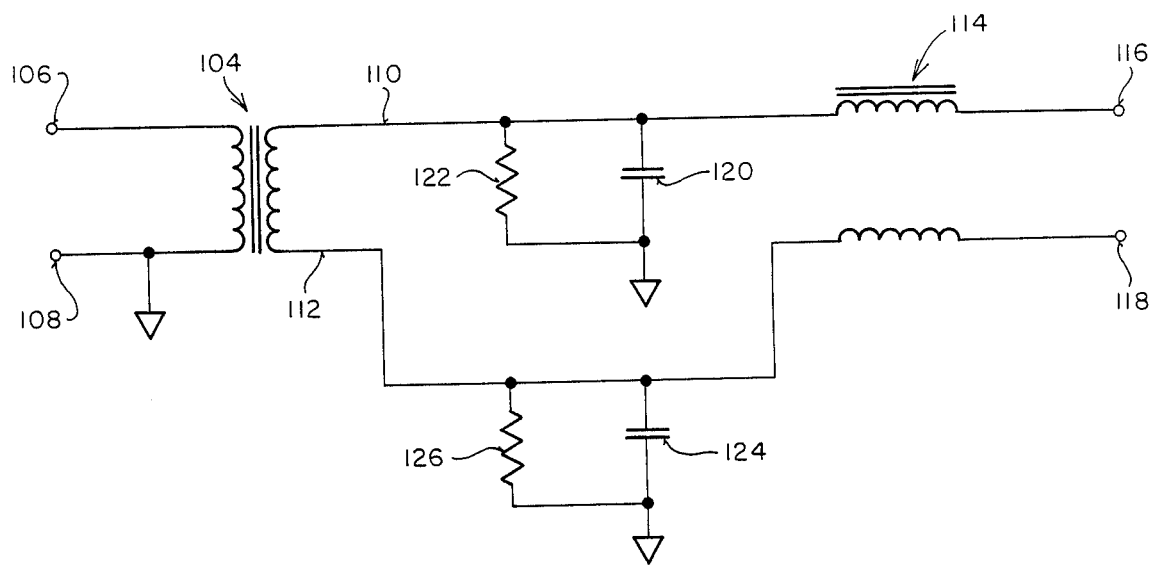
FIG_6

BALUN

This is a continuation of application Ser. No. 795,347, filed Nov. 5, 1985, now abandoned, which was a continuation-in-part of Ser. No. 715,129, filed Mar. 21, 1985, now U.S. Pat. No. 4,717,896.

BACKGROUND OF THE INVENTION

The present invention relates to a device for a balanced to unbalanced line transformation (balun).

A balun is a device which is used as a transition between an unbalanced line and a balanced line. An unbalanced two-wire line is one having one of the two conductors grounded, such as a coaxial cable with the outer shield grounded. A balanced two-wire line is one in which neither of the two conductors is grounded and both have essentially identical impedances to ground. A transmission line may also be partially unbalanced if one wire has a lower impedance to ground than the other wire. A balun is usually a transformer which allows electrical isolation of the unbalanced line from the balanced line. The use of a transformer also allows impedance matching from the unbalanced line to the balanced line. This is done by varying the ratio of the number of turns of the balanced and unbalanced wires on the transformer. A bifilar winding is often used to improve the coupling between the primary and secondary of the transformer. A bifilar winding is the winding in close proximity of the primary and secondary wires over the same core.

At high frequencies, a transformer's efficiency as a balun is limited because of limits in the value of the coefficient of coupling of a transformer. A transformer can be connected as a choke, with there being a direct electrical connection from input to output, rather than electrically isolating the input and the output with a standard transformer connection. A balun which is connected as a choke will perform the balun function of isolating the balanced and the unbalanced lines if the open circuit inductance is sufficiently large at the desired frequencies compared to the impedance to ground from the balanced lines.

The desired signal which is transmitted along the two wire conductors and through the balun is a differential signal (i.e., the signal appears between the two wires of the line). Electrical noise will generate an interfering signal which is picked up equally by both conductors and is called a common mode signal (i.e., the signal appearing between each of the conductors and ground). The standard choke-type balun does not substantially attenuate the common mode interference signal which may be picked up by either the balanced or unbalanced line.

In certain applications, such as the transmission of computer data, there is a need for a broad frequency band balun, with high common mode rejection. The digital data transmitted may go as low as DC and hiqher than the operating bit rate which presently can be as great as 10 MHz. Neither a standard transformer-type balun nor a standard choke-type balun is suitable for this application because of the problems referred to above. In addition, in order to keep costs down it is desirable to use low cost twisted-pair wire and as little expensive coaxial cable as possible between elements of a computer system. A type of twisted pair wire having a line impedance similar to that of coaxial cable can be used. This eliminates the need for impedance matching in a balun, but the need for a balun which will transmit a large bandwidth of frequencies while filtering out unwanted common mode noise remains. Efforts to supply a balun meeting the above requirements have not been successful to date.

SUMMARY OF THE INVENTION

The present invention comprises a balun for intercoupling an at least partially unbalanced line and a substantially balanced line having similar line impedances which is capable of passing differential signals over a wide bandwidth while substantially attenuating any common mode signals.

In one aspect, the balun comprises a pair of transformers with bifilar windings, each connected as a choke. Each conductor of the unbalanced line is coupled to a different one of two substantially identical inductances of the first transformer and the other side of each inductance is coupled through the second transformer to a different one of the two conductors of the balanced line. Each of the connections between the two transformers is separately coupled to ground with a substantially identical capacitance used in each circuit. The capacitance in conjunction with the inductance acts to filter out the common mode signals while allowing the differential mode signals to pass through the balun. Each of the transformers coupling the capacitance to a transmission line has sufficient inductance to prevent differential signals in either direction from being shunted to ground. Preferably, a resistor is added in parallel to each of the capacitances to provide for common mode attenuation at the resonant frequency of the system capacitance and inductances.

In order to attenuate the common mode signal, the impedance of the parallel combination of the two capacitor-resistor pairs must be low compared to the open circuit impedance of the transformer over the relevant bandwidth. At the same time, the impedance of the series combination of the two capacitor-resistor pairs must be high relative to the line impedance to avoid siqnificant attenuation of the differential mode signal. The choke connected transformers should have a short circuit impedance which is low relative to the line impedance and an open circuit impedance which is high.

When used in an office wiring application, the ground connection for the capacitor-resistor pairs can be made to the shield of a coaxial cable if no building ground is conveniently available. The balun can also be used for coupling two wire pairs when one of the wire pairs is partially unbalanced. A wire pair may also be enclosed in a grounded shield, thus providing a convenient ground connector.

In an alternate confiquration, the transformer coupled to the unbalanced line is connected in a standard transformer configuration rather than as a choke. Each of the connections between the transformer and the choke is separately coupled to ground with a substantially equal capacitance used in each circuit. This configuration allows existing baluns using transformers to be modified by the addition of a choke and capacitors.

The present invention uniquely applies filtering techniques to a balun, which have not been used in the past because of the accompanying attenuation of the differential mode signal, which is an undesirable result. The invention, however, substantially attenuates the common mode signal while providing a minimal attenuation of the differential mode signal in the frequency ranges commonly used for computer data transmission.

For a fuller understanding of the nature and advantages of the invention, reference should be made to the ensuing detailed description taken in conjunction with the accompanying drawings.

BRIEF DESCRIPTION OF THE DRAWINGS

FIGS. 4A and 4B are schematic drawings of the equivalent balun circuit of the present invention for common mode and differential mode signals, respectively; and FIG. 5 is a schematic drawing of the balun of FIG. 3 connected to a four wire line.

FIG. 6 is a schematic drawing of an alternate embodiment of a balun according to the present invention utilizing a transformer and a choke.

DETAILED DESCRIPTION OF THE PREFERRED EMBODIMENT

Figure 1:
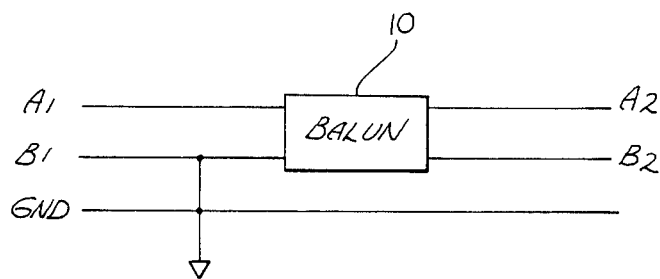
FIG. 1 is a block diagram of a standard balun circuit.

Turning now to the drawings, FIG. 1 is a block diagram of the standard connections of a conventional balun 10. As seen in this Fig., wires $A_1$ and $B_1$, which form the unbalanced line, are connected on one side of balun 10 with wire $B_1$ being coupled to ground. Wires $A_2$ and $B_2$, which form the balanced line, are coupled to the other side of balun 10. Wires $A_2$ and $B_2$ are coupled to a load circuit (not shown) in which $A_2$ and $B_2$ are isolated from ground by substantially identical impedances. As long as the impedance through the balun to ground is large compared to the impedances of $A_2$ and $B_2$ to ground, the balun function of providing a balanced to unbalanced transition is achieved.

Figure 2A:
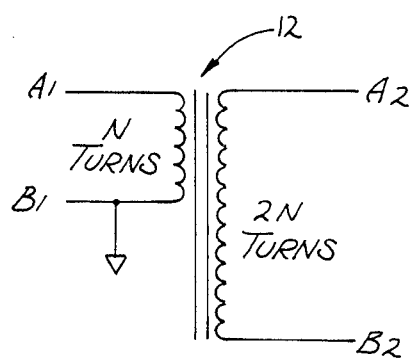
FIGS. 2A and 2B are schematic drawings of a prior art isolation balun and a choke balun, respectively.

FIG. 2 shows a prior art isolation transformer balun used for relatively low frequency impedance matching applications. An unbalanced line with two wires, $A_1$ and $B_1$, is coupled to transformer 12 with wire $B_1$ being grounded. A balanced line with wires $A_2$ and $B_2$ is also wound onto transformer 12. By using electrical isolation, the transformation between the unbalanced line, $A_1$ and $B_1$, and the balanced line, $A_2$ and $B_2$, is achieved. Unbalanced line $A_1$, $B_1$ is typically a coaxial cable with wire $B_1$ being the shield of the cable which is grounded. Balanced line $A_2$, $B_2$ could be a standard two wire twisted pair line. In addition to providing the unbalanced to balanced transformation, this balun can provide impedance matching by stepping up or down the voltage in accordance with the number of turns on transformer 12. For example, if line $A_1$, $B_1$ is a coaxial cable with a 75 ohm characteristic impedance and line $A_2$, $B_2$ has an impedance of 300 ohms, the impedance transformation is achieved by using N turns on the $A_1$, $B_1$ winding of the transformer and 2N turns on the $A_2$, $B_2$ side of the transformer.

Figure 2B:
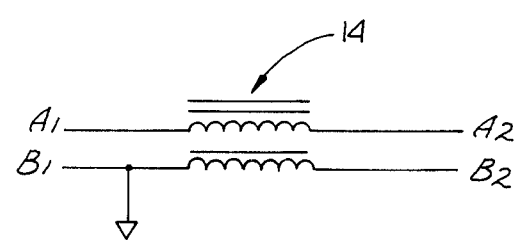

FIG. 2B shows a prior art choke-connected balun used for relatively high frequency coupling between an unbalanced and balanced line. A transformer 14 in FIG. 2B is connected as a choke, with there being a direct electrical connection between $A_1$ and $A_2$ and between Band $B_2$. The balun isolation function is achieved by selecting a transformer 14 having sufficiently large impedance at the relevant signalling frequencies to isolate line $A_2$, $B_2$ from line $A_1$, $B_1$, which is grounded.

Figure 3:
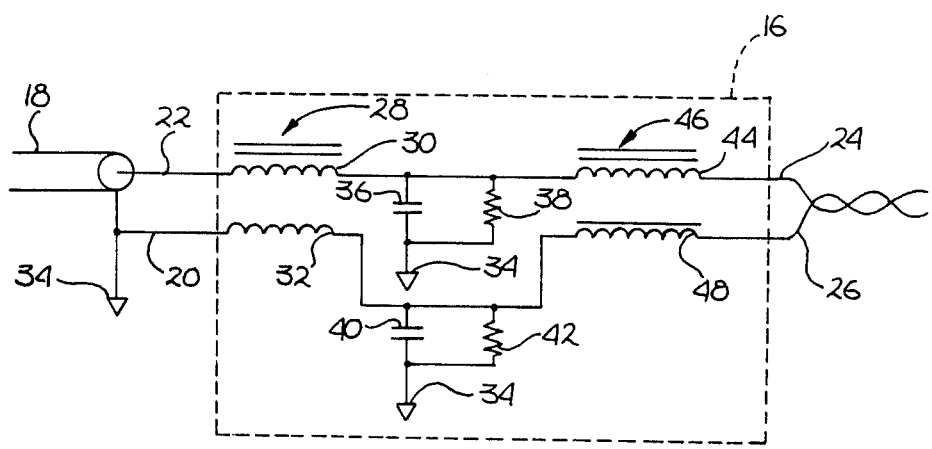
FIG. 3 is a schematic drawing of the balun of the present invention.

FIG. 3 shows one embodiment of a balun 16 of the present invention. A coaxial cable 18 having a grounded shield line 20 and ungrounded line 22 is coupled to balun 16. The other end of balun 16 is coupled to a pair of twisted wires 24 and 26. Line 22 is coupled to a first inductance 30 of transformer 28 while line 20 is coupled to a second inductance 32. The other side of inductance 30 is coupled to ground 34 by a capacitor 36 and a resistor 38 connected in parallel to capacitor 36. Likewise, inductance 32 is coupled to ground by a capacitor 40 and a resistor 42 coupled in parallel to capacitor 40. Inductance 30 is coupled to line 24 via a second inductance 44 of a second transformer 46. Inductance 32 is coupled to line 26 by a first inductance 48 of transformer 46.

The operation of balun 16 is best seen by referring to FIGS. 4A and 4B. The impedance of capacitor 36, resistor 38 and capacitor 40, resistor 42 appear in parallel for the common mode signal (FIG. 4A) and in series for the differential mode signal (FIG. 4B). The source impedance for the common mode signal is the open circuit impedance of the transformer 28 or 46, which is high. The source impedance for the differential mode signal is the short circuit impedance of transformer 28 or 46, which is low. FIG. 4A is the equivalent circuit of balun 16 for the common mode signal looking at only one of transformers 28 or 46 as represented by an inductance 50. If balun 16 is made with about twenty feet of twisted-pair wire having a characteristic impedance of 100 Ω, the leakage inductance Lsc would be about 2 μH and the open circuit inductance Loc would be about 100,000 μH. If capacitor 36C is assumed to be 100 picofarads (pF) and resistors 38 and 42R are assumed to be 1000 ohms, the common mode attenuation for this circuit is given by the following equation:

$$\frac{\frac{(R/2)*(1/j\omega 2C)}{(R/2 + 1/j\omega 2C)}}{j\omega\, L_{oc} + \frac{(R/2)*(1/j\omega 2C)}{(R/2 + 1/j\omega 2C)}} \qquad \text{Eq. 1}$$

Equation 1, with the above values being inserted for the resistance and capacitance, reads as follows:

$$\frac{(500\Omega)\left(\frac{1}{j\omega\, 200\text{pF}}\right)}{\left(500\Omega + \frac{1}{j\omega\, 200\text{pF}}\right)} \qquad \text{Eq. 1}$$

$$j\omega\, L_{oc} + \frac{(500\Omega)\left(\frac{1}{j\omega\, 200\text{pF}}\right)}{\left(500\Omega + \frac{1}{j\omega\, 200\text{pF}}\right)}$$

At 1 megahertz (mHz), the attenuation is approximately 60 dB. At 0.1 mHz, the attenuation is approximately 30 dB.

FIG. 4B shows equivalent circuit for the differential mode signal. The differential mode attenuation for the equivalent circuit of FIG. 4B is given by the following equation:

$$\frac{\frac{(2R)*(1/j\omega(C/2))}{2R + 1/j\omega(C/2)}}{j\omega\, L_{sc} + \frac{(2R)*(1/j\omega(C/2))}{2R + 1/j\omega(C/2)}} \qquad \text{Eq. 2}$$

Equation 2, rewritten to incorporate the resistance and capacitance values set forth above, reads as follows:

$$j\omega\, Lsc + \frac{(2000\Omega)\left(\frac{1}{j\omega\, 50pF}\right)}{\left(2000\Omega + \frac{1}{j\omega\, 50pF}\right)} \cdot \frac{(2000\Omega)\left(\frac{1}{j\omega\, 50pF}\right)}{\left(2000\Omega + \frac{1}{j\omega\, 50pF}\right)} \quad \text{Eq. 2}$$

The differential mode attenuation for 0.1 mHz and 1 mHz is approximately 0 dB, and for 10 mHz approximately 2 dB.

It can thus be seen from the above equations that the common mode noise is greatly attenuated by the balun of the present invention, while the differential signal is passed through with only insignificant attenuation.

In order to attenuate the common mode signal, the impedance of the parallel combination of the two capacitor-resistor pairs must be low compared to the open circuit impedance of the transformer over the relevant bandwidth. At the same time, the impedance of the series combination of the two capacitor-resistor pairs must be high relative to the line impedance to void significant attenuation of the differential mode signal. The choke connected transformers should have a short circuit impedance which is low relative to the line impedance and an open circuit impedance which is high. Two transformers 28, 46 are used, one on each side of capacitors 36, 40, so that the transmission line source impedance is not shorted to ground by the capacitors.

In one specific implementation, the balun was constructed using two bifilar transformers 28, 46 with 250 turns of #34 enameled wire on a triple section bobbin and a 2213P3E2A Ferroxcybe core (with approximately 100,000 μH open circuit inductance). Capacitors 36, 40 were 200 pF each and resistors 38, 42 were 3.3 kΩ each. The ratio of common mode attenuation to differential mode attenuation was measured from the twisted pair to the coaxial cable using a load impedance of 100Ω between lines 22, 20 and a source impedance of 47Ω on each of lines 24, 26. The ratio of common mode attenuation to differential mode attenuation was over 60 dB for frequencies above 100 kHz.

Any transformer used to produce the inductance for the present circuit will have a parasitic capacitance in parallel with the inductance which will degrade the performance of the inductor. In order to minimize the adverse effect of this parasitic capacitance, the winding should preferably be kept as far away from the core as possible if the core is grounded, or the core may be kept away from ground.

To keep the short circuit inductance (leakage inductance) of transformers 28, 46 low, the wires should be wound as closely together as possible. Although a large open circuit inductance is desired, practical limitations are size and line loss through the transformer.

The capacitors 36 and 40 and resistors 38 and 42 should be substantially matched. Any variation will result in a conversion of common mode signal to differential mode signal due to the variation in source impedance. However, the use of transformers on either side of the capacitor-resistor pairs with significant inductance dominates the source impedance and makes small variations in such capacitors and resistors insignificant.

A second balun substantially identical to balun 16 may be used to couple the other end of twisted pair 24, 26 to another coaxial cable which acts as an input to another element in a computer system. Such a configuration is shown for a 4-wire balun in FIG. 5.

FIG. 5 shows an alternate configuration in which two baluns 52, 54 are connected to a four wire line. Each of baluns 52, 54 uses a three winding (trifilar) transformer. For balun 52, a coaxial cable 56 has its ungrounded conductor 58 coupled to a first winding 60 of a transformer 62. A second coaxial cable 64 has its ungrounded line 66 coupled to a second winding 68 of transformer 62. The grounded shields 70, 72 of cables 56 and 64, respectively, are coupled to a third winding 74 of transformer 62.

The other leads of windings 60, 74 and 68 are coupled to ground by capacitors 76, 78 and 80, respectively. Resistors 82, 84 and 86 are coupled in parallel with capacitors 76, 78 and 80, respectively. Windings 60, 74 and 68 are then coupled to windings 88, 90 and 92, respectively, of a second transformer 94 of balun 54. Windings 88 and 92 are each coupled to one conductor of twisted pairs 96 and 98, respectively. Winding 90 is coupled to each of the other conductors of twisted pairs 96, 98. The configuration of balun 54 is identical to that of balun 52.

By using baluns 52, 54, a computer signal from two coaxial cables 56, 64 can be extended over long distances within a building using inexpensive twisted pairs 96, 98. In particular, the computer signal associated with a first source can be coupled to lines 58, 70 and a siqnal associated with a second separate source can be coupled to lines 66, 72. This unique configuration allows a single balun to be used commonly by more than one source, thus reducing the number of baluns needed. The twisted pairs 96, 98 can then be coupled to other computer hardware using balun 54 and coaxial cables 100, 102. Larger numbers of lines can be combined by similarly connecting the ground line to inductance 74 and one of the balanced lines to inductance 90, while adding a new inductance pair, capacitor and resistor for the other wire.

An alternate embodiment utilizing a choke and a transformer is shown in FIG. 6. This configuration is particularly useful where a system already has in place or is adapted to use a common transformer as a balun. A transformer 104 has unbalanced terminals 106, 108 coupled to a first winding. The other winding is coupled via lines 110, 112 to a choke 114 and balanced line terminals 116, 118. A capacitor 120 and a resistor 122 are coupled between line 110 and ground. A capacitor 124 and a resistor 126 are coupled between line 112 and ground.

Although the circuit of FIG. 6 will not work at DC, as will the circuit of FIG. 3, it will provide improved performance in many applications. The lower frequency limit is determined by the characteristics of the transformer. Transformers are available which will accommodate low data frequency rates of 100 KHz which may appear on an IBM 3278 computer, for instance. Other transformers will accommodate voice grade signals down to around 300 Hz.

By closely spacing the windings of transformer 104, the parasitic capacitance across the windings is reduced. The parasitic capacitance from the windings to ground will increase as a result of decreasing the parasitic capacitance between the windings, but the latter capacitance is in parallel with capacitors 120, 124 and is thus not critical.

As will be understood by those familiar with the art, the present invention may be embodied in other specific forms without departing from the spirit or essential characteristics thereof. For example, the circuit can be constructed using only a capacitor and no resistor for some applications. One such application would be where the data frequency will never equal the resonant frequency of the L-C network. Accordingly, the disclosure of the preferred embodiment of the invention is intended to be illustrative, but not limiting, of the invention which is set forth in the following claims.

What is claimed is:

1. A balun which substantially attenuates common mode signals without significantly attenuating differential mode signals for coupling an at least partially unbalanced line having at least a first and a second conductor to a balanced line having at least a first and a second conductor, comprising:
   a first inductance adapted to have a first lead coupled to said first conductor of said unbalanced line and adapted to have a second lead coupled to said second conductor of said unbalanced line;
   a second inductance sharing a common core with said first inductance and having a substantially equal value to said first inductance;
   a third inductance having a first coupled to a first lead of said second inductance and adapted to have a second lead coupled to said first conductor of said balanced line;
   a fourth inductance having a first lead coupled to a second lead of said second inductance and adapted to have a second lead coupled to said second conductor of said balanced line, said fourth inductance sharing a common core with said third inductance and having a substantially equal value to said third inductance; and
   a first capacitance coupling said first lead of said second inductance to a ground potential, and a second capacitance coupling said second lead of said second inductance to the ground potential for substantially attenuating the common mode signals without significantly attenuating the differential mode signals, wherein the common mode signals are one-half the sum of the voltage between the first conductor of the unbalanced line and the ground potential and the voltage between the second conductor of the unbalanced line and the ground potential and wherein the differential mode signals are the difference between the voltage from the first conductor of the unbalanced line to the ground potential and the voltage from the second conductor of the unbalanced line to the ground potential,
   said first and second capacitances satisfy the equation $1/(2\omega C) << \omega L_{oc}$ to substantially attenuate the common mode signals and satisfy the equation $1/(\omega C/2) >> \omega L_{sc}$ to avoid attenuating the highest frequencies of the differential mode signals used for transmission, where $L_{oc}$ is the open circuit inductance, $L_{sc}$ is the short circuit inductance and $\omega$ is $2\pi$ times the highest frequency of the differential mode signals used for transmission.

2. The balun of claim 1 further comprising:
   a first resistance coupled in parallel with said first capacitance; and
   a second resistance coupled in parallel with said second capacitance, said second resistance being substantialy equal in value to said first resistance.

3. The balun of claim 2 wherein the value of the parallel combination of said first resistance and capacitance in parallel and said second resistance and capacitance in parallel is lower than the open circuit impedance of said third and fourth inductances to substantially dampen the common mode signals and the series combination of said first resistance and capacitance in parallel and said resistance and capacitance in parallel is higher than the line impedance of said balanced line to avoid significantly attenuating the differential mode signals used for transmission.

4. The balun of claim 2 wherein the values of said capacitances and resistances are chosen so that the impedance of the parallel combination of (a) said first capacitance and resistance in parallel with (b) said second capacitance and resistance in parallel is substantially smaller than the open circuit impedance of said third and fourth inductances, and the impedance of the series combination of (c) said first capacitance and resistance in parallel with (d) said second capacitance and resistance in parallel is substantially larger than the line impedance of one of said balanced line and said unbalanced line.

* * * * *